US010256967B2

(12) United States Patent
Huang et al.

(10) Patent No.: US 10,256,967 B2
(45) Date of Patent: Apr. 9, 2019

(54) CLOCK AND DATA RECOVERY CIRCUIT WITH JITTER TOLERANCE ENHANCEMENT

(71) Applicant: Novatek Microelectronics Corp., Hsinchu (TW)

(72) Inventors: Chang-Cheng Huang, Taichung (TW); Shen-Iuan Liu, Taipei (TW); Ju-Lin Huang, Hsinchu County (TW); Tzu-Chien Tzeng, Hsinchu (TW); Keko-Chun Liang, Hsinchu (TW); Yu-Hsiang Wang, Hsinchu (TW); Che-Wei Yeh, New Taipei (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 15/863,983

(22) Filed: Jan. 8, 2018

(65) Prior Publication Data

US 2018/0198597 A1     Jul. 12, 2018

Related U.S. Application Data

(60) Provisional application No. 62/442,994, filed on Jan. 6, 2017.

(51) Int. Cl.
*H04L 7/00*     (2006.01)
*H03L 7/08*     (2006.01)
*H03L 7/091*    (2006.01)
*H03L 7/093*    (2006.01)
*H03L 7/089*    (2006.01)

(52) U.S. Cl.
CPC .......... *H04L 7/0016* (2013.01); *H03L 7/0807* (2013.01); *H03L 7/0891* (2013.01); *H03L 7/091* (2013.01); *H03L 7/093* (2013.01)

(58) Field of Classification Search
CPC ... H04L 7/0016; H03L 7/0807; H03L 7/0891; H03L 7/091; H03L 7/093
USPC .......................................................... 375/371
See application file for complete search history.

(56) References Cited

U.S. PATENT DOCUMENTS

| | | | |
|---|---|---|---|
| 5,448,598 A * | 9/1995 | Yousefi | H03L 7/0898 327/156 |
| 5,525,935 A * | 6/1996 | Joo | H03L 7/143 327/156 |
| 8,203,369 B2 | 6/2012 | van de Beek | |
| 8,634,510 B2 | 1/2014 | Kong et al. | |
| 9,100,024 B2 * | 8/2015 | Iravani | H03L 7/0807 |
| 9,203,369 B2 * | 12/2015 | Cook | H03H 7/01 |
| 9,455,725 B2 | 9/2016 | Hung et al. | |
| 9,935,719 B1 * | 4/2018 | Saeedi | H04B 10/6164 |
| 2011/0182390 A1 * | 7/2011 | Lin | H03L 1/022 375/371 |

(Continued)

*Primary Examiner* — Helene E Tayong
(74) *Attorney, Agent, or Firm* — JCIPRNET

(57) ABSTRACT

A clock and data recovery circuit with jitter tolerance enhancement is provided. The CDR circuit includes: a bang-bang phase detector, a digital filter, a digitally controlled oscillator, and an adaptive loop gain control circuit. The CDR circuit detects a loop bandwidth variation and adjusts the loop bandwidth of CDR circuit by adjusting proportional path and integral path gain factors of the digital filter of the CDR circuit. The loop gain controller uses two methods to adjust the loop gain in CDR circuit: bang-bang adjusting method and linear adjusting method.

16 Claims, 10 Drawing Sheets

(56) References Cited

U.S. PATENT DOCUMENTS

2013/0259178 A1* 10/2013 Bae .................. H04L 7/007
  375/376
2014/0126656 A1* 5/2014 Chung ............... H04L 7/0331
  375/259
2015/0263848 A1 9/2015 Mobin et al.

* cited by examiner

CLOCK AND DATA RECOVERY CIRCUIT WITH JITTER TOLERANCE ENHANCEMENT

CROSS-REFERENCE TO RELATED APPLICATION

This application claims the priority benefit of U.S. provisional application Ser. No. 62/442,994, filed on Jan. 6, 2017. The entirety of the above-mentioned patent application is hereby incorporated by reference herein and made a part of this specification.

BACKGROUND

Technical Field

The present disclosure relates to a clock and data recovery circuit, and more particularly, to a clock and data recovery circuit with jitter tolerance enhancement by detecting variation in the loop bandwidth thereby adjusting the loop bandwidth.

Description of Related Art

A receiver of a high-speed transmission system often has to perform an appropriate recovery processing to the input data signal to detect an embedded clock signal by using a clock and data recovery (CDR) circuit. A conventional CDR circuit includes a bang-bang phase detector (BBPD), a loop filter and an oscillator. In terms of operation, the oscillator may generate a sampling clock signal, and the bang-bang phase detector may generate an output data signal from an input data signal by using the sampling clock signal. The bang-bang phase detector may also generate a phase difference information signal which includes logic values indicating the sign of a phase difference between the input data signal and the sampling clock signal.

However, use of the bang-bang phase detector for generating phase difference information leads to two issues, one is the bang-bang phase detector may have different gain due to varying jitter in the input data, which cause loop bandwidth to vary frequently, and the other issue is the input data having a high transition density may results in significant change in bandwidth, thus affecting the performance of the CDR circuit.

SUMMARY

The disclosure provides a circuit to detect a loop bandwidth variation of a clock and data recovery (CDR) circuit, and adjust a loop bandwidth of the CDR circuit by adjusting proportional path and integral path gain factors of a digital filter of the CDR circuit. Accordingly, the CDR circuit is able to maintain a proper loop bandwidth and increase jitter tolerance.

The CDR circuit of the present disclosure provides jitter tolerance enhancement in the CDR circuit, which includes: a bang-bang phase detector (BBPD), a digital filter, a digitally controlled oscillator (DCO), and an adaptive loop gain control (ALGC) circuit. The ALGC circuit generates the information for adjusting the loop bandwidth of the CDR circuit according to the phase difference information signal from BBPD. The loop bandwidth of the CDR circuit is adjusted by adjusting gain factors in the loop gain of the CDR circuit. For adjusting the loop bandwidth of the CDR circuit, two possible methods are alternatively adopted by the ALGC circuit, including: a bang-bang adjusting method, and a linear adjusting method. Thereby, the CDR circuit may have a better jitter tolerance.

In order to make the aforementioned and other features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
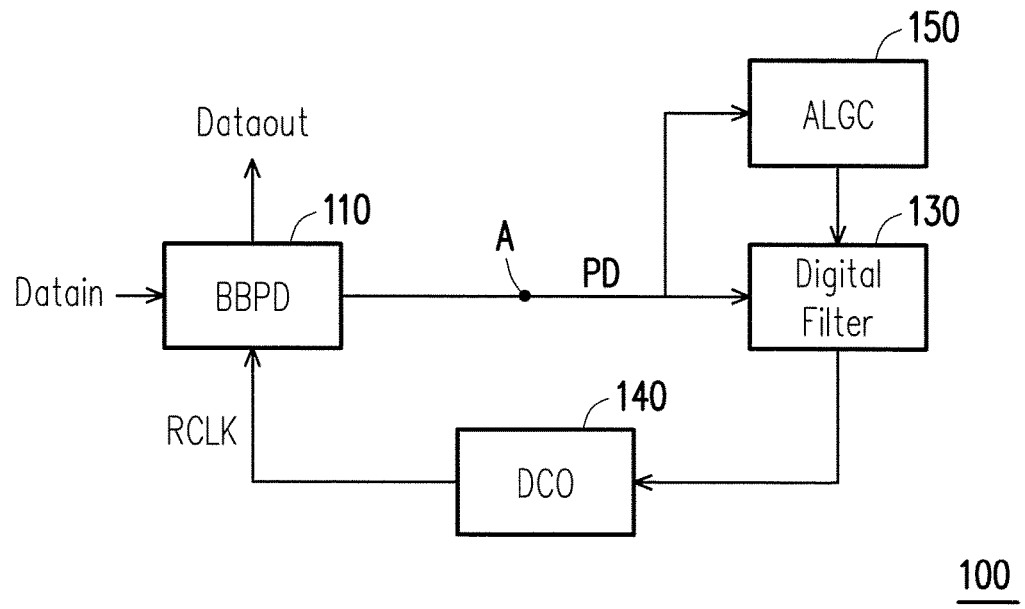
FIG. 1 is a schematic circuit block diagram of a clock and data recovery (CDR) circuit according to an exemplary embodiment of the disclosure.

A term "couple" used in the full text of the disclosure (including the claims) refers to any direct and indirect connections. For an instance, if a first circuit is described to be coupled to a second circuit, it is interpreted as that the first circuit is directly coupled to the second circuit, or the first circuit is indirectly coupled to the second circuit through other circuit or connection means. Moreover, wherever possible, components/members/steps using the same referential numbers in the drawings and description refer to the same or like parts. Components/members/steps using the same referential numbers or using the same terms in different embodiments may cross-refer to related descriptions.

FIG. 1 is a schematic block diagram of a clock and data recovery (CDR) circuit 100 according to an exemplary embodiment of the disclosure. As shown in FIG. 1, the CDR circuit 100 includes a bang-bang phase detector (BBPD)

110, a digital filter 130, a digitally controlled oscillator (DCO) 140, and an adaptive loop gain control (ALGC) circuit 150. The BBPD 110 receives an input data signal Datain with an embedded clock signal, and samples the input data signal by a sampling clock signal RCLK (a.k.a. retime clock) received from the DCO 140 to generate an output data signal Dataout (a.k.a. retimed data). The BBPD 110 also generates a phase difference information signal PD, which is logic "1" or "0" indicating the sign (which is also called polarity or polarity sign,) + or − of the phase difference between the input data signal Datain and the sampling clock signal RCLK. In this embodiment, the phase compensation rate of the BBPD 110 may be 1/N of the input data rate, where N is a positive integer. The ALGC circuit 150, also referred as a loop gain controller, is coupled to the BBPD 110, and is utilized for detecting a first plurality of consecutive logic values in the phase difference info nation signal PD, and adjusting gain factors according to the first plurality of consecutive logic values. The digital filter 130 is coupled to the ALGC circuit 150 and the BBPD 110, filters the phase difference information signal PD to generate a filtered signal. The digital filter 130 may be programmable N-tap, M-bit programmable infinite impulse response (IIR) filter or a N-tap, M-bit programmable finite impulse response (FIR) filter, or M-bit proportional-integral-derivative (PID) controller, where M and N are positive integers. The DCO 140 is coupled to the digital filter 130 and the BBPD 110, receives the filtered signal and generates the sampling clock signal RCLK according to the filtered signal. The DCO 140 may be a digitally controlled ring oscillator or a digitally controlled LC oscillator. In another embodiment, the DCO 140 may be replaced by a voltage-controlled ring oscillator or a voltage-controlled LC oscillator.

Figure 2:
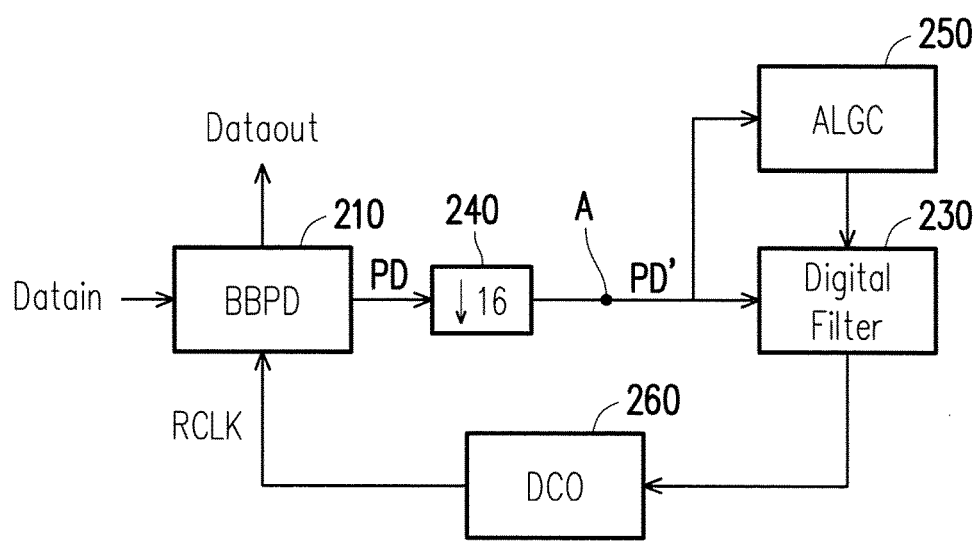
FIG. 2 is a schematic circuit block diagram of a CDR circuit according to yet another exemplary embodiment of the disclosure.

FIG. 2 is a schematic block diagram of a CDR circuit 200 according to another exemplary embodiment of the disclosure. The CDR circuit 200 includes a bang-bang phase detector (BBPD) 210, a digital filter 230, a down-sampling circuit 240 (or called a decimator), an adaptive loop gain control (ALGC) circuit 250, and a digitally controlled oscillator (DCO) 260. One end of the down-sampling circuit 240 is coupled to the BBPD 220 to receive the phase difference information signal PD and the other end of the down-sampling circuit 240 is coupled to the digital filter 230 and the ALGC circuit 250. The down-sampling circuit 240 down-samples the phase difference information signal PD and outputs a down-sampled phase difference information signal PD' to the digital filter 230 and the ALGC circuit 250. In this embodiment, the down-sampling ratio may be 1/16 as an example. In another example, the down-sampling ratio may be 1/4 (that would be better than 1/16) or any other ratio not limited thereto, as long as it is acceptable for the digital filter 230 to process the down-sampled phase difference information signal PD'. It is noted that if the digital filter 230 have enough capability to process high-speed signals, the down-sampling circuit 240 may be not necessary and the ALGC circuit 250 may generate information for adjusting the loop bandwidth of the CDR circuit 200 according to the phase difference information signal from the BBPD 210, as the ALGC circuit 150 of FIG. 1 does.

Figure 3A:
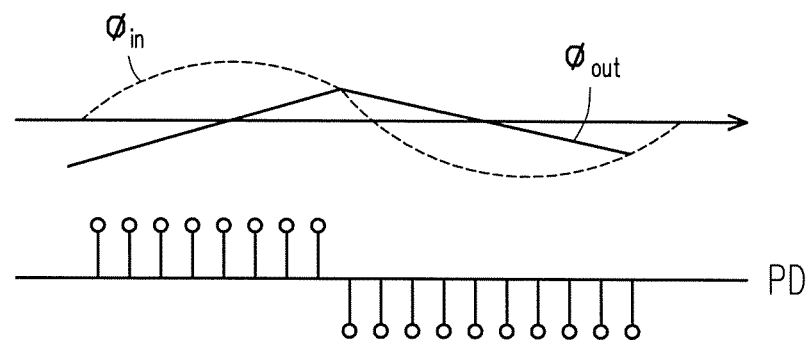
FIG. 3A and FIG. 3B are schematic signal diagrams of sign indicated by a phase difference information signal in different loop bandwidth conditions.
Figure 3B:
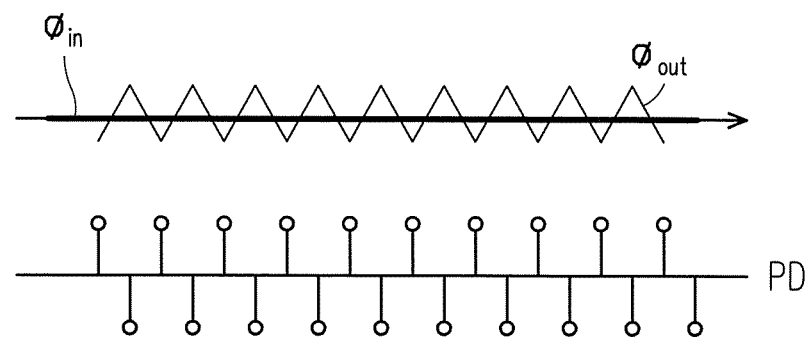

FIG. 3A and FIG. 3B are schematic signal diagrams of the sign indicated by the phase difference information signal PD (or the down-sampled phase difference information signal PD') in different loop bandwidth conditions. The phase difference information signal PD is a signal on the output node of the BBPD 110, which is a node A shown in FIG. 1. $\phi_{in}$ is the phase of the input data signal Datain and $\phi_{out}$ is the phase of the sampling clock signal RCLK. If the loop bandwidth of the CDR circuit 100 is not wide enough, the CDR circuit 100 may not be able to fully compensate the phase difference between the input data signal Datain and the sampling clock signal RCLK, and in such a condition the sign indicated by the phase difference information signal PD may include a plurality of continuous positive signs and negative signs as illustrated in FIG. 3A. That is, there is a need to increase the loop bandwidth of the CDR circuit 100. During this condition, the ALGC circuit 150 may receive the phase difference information signal including a plurality of continuous same logic "1"s and plurality of continuous same logic "0"s.

On the contrary, when the loop bandwidth of the CDR is too wide, the CDR circuit 100 may excessively compensate the phase difference between the input data signal Datain and the sampling clock signal RCLK in every period, and in such a condition the sign may change at every period so that the signs includes alternative positive and negative signs as illustrated in FIG. 3B. That is, there is a need to decrease the loop bandwidth of the CDR circuit 100. During this condition, the ALGC circuit 150 may receive the phase difference information signal PD including a plurality of continuous logic "1"s and plurality of continuous logic "0"s which are not continuous same but alternate between "1" and "0".

With reference to FIG. 1 in one of the embodiment, adjusting the loop bandwidth of the CDR circuit 100 may be implemented by adjusting gain factors associated with the loop gain of the CDR circuit 100, which include an integral path gain factor and a proportional path gain factor. An open loop gain of the CDR circuit 100 of the present disclosure is expressed as $$G_{open\ loop} = \rho K_{BBPD} \left( \frac{\alpha}{1 - Z^{-1}} + \beta \right) \frac{K_{DCO}}{1 - Z^{-1}},$$

where $\alpha$ is the integral path gain factor, $\beta$ is the proportional path gain factor, $\beta$ is an transition density, $K_{DCO}$ is the period gain of the DCO140, $K_{BBPD}$ is the gain of the BBPD 110.

The ALGC circuit 150 adjusts the values of the integral path gain factor $\alpha$ and the proportional path gain factor $\beta$ for tuning the open loop gain, such that the loop bandwidth of the CDR circuit 100 may be adjusted correspondingly. In detail, if the loop bandwidth of the CDR circuit 100 is larger than the expected (pre-determined) bandwidth, the proportional path gain factor $\beta$ may be reduced by a unit value. Similarly, the integral path gain factor $\alpha$ may be reduced to keep a predetermined ratio ($\beta/\alpha = \beta_0/\alpha_0$) to keep the stability of the CDR circuit 100, wherein $\alpha_0$, $\beta_0$ are pre-set values. When the gain factors $\alpha$ and $\beta$ are reduced, a quantization error is improved.

On the other hand, if the loop bandwidth of the CDR circuit 100 is smaller than the expected bandwidth, the proportional path gain factor $\beta$ may be increased by a unit value and the integral path gain factor $\alpha$ may be increased to keep the predetermined ratio ($\beta/\alpha = \beta_0/\alpha_0$) to keep the stability of the CDR circuit 100. When the gain factors $\alpha$ and $\beta$ are increased, phase tracking is improved.

Figure 4:
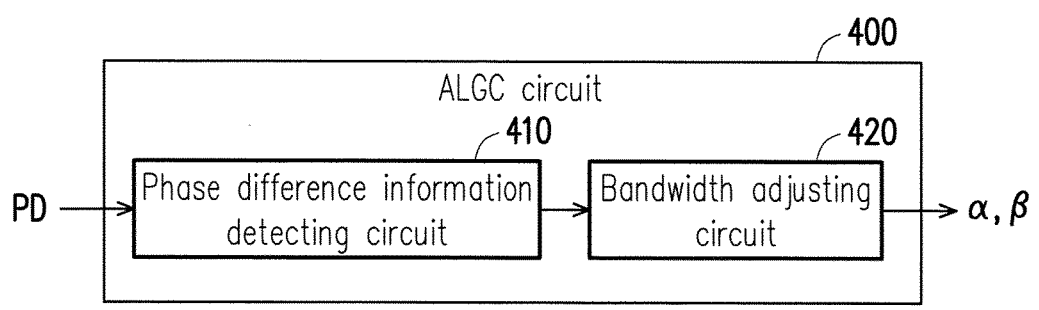
FIG. 4 is a block diagram of an adaptive loop gain control (ALGC) circuit according to an exemplary embodiment of the disclosure.

FIG. 4 is a schematic block diagram of an adaptive loop gain control (ALGC) circuit 400 according to an exemplary embodiment of the disclosure. The ALGC circuit 400 may be used as the ALGC circuit 150 of FIG. 1 or the ALGC circuit 250 of FIG. 2. The ALGC circuit 400 includes a phase difference information detecting circuit 410 and a bandwidth adjusting circuit 420. For example, the phase difference information detecting circuit 410 may be implemented by using a digital sampling circuit or an analog comparison circuit, and the bandwidth adjusting circuit 420 may be implemented by a finite state machine, a digital accumulator or an analog circuit.

Figure 5:
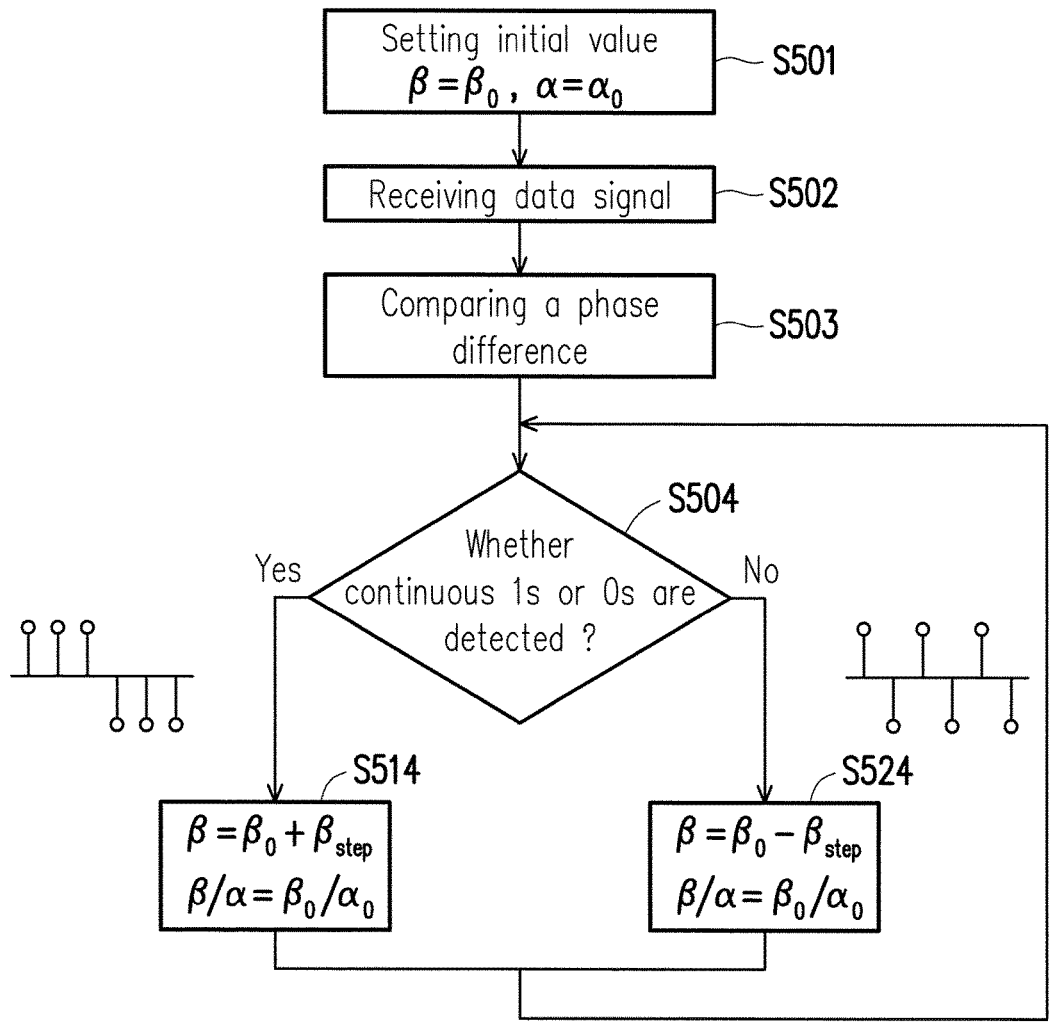
FIG. 5 is a flow chart diagram of a bang-bang adjusting method according to an exemplary embodiment of the disclosure.

According to embodiments of the present disclosure, a bang-bang adjusting method or a linear adjusting method is adopted in the CDR circuit and the adopted method may be implemented in hardware circuitry. FIG. 5 is a flow chart diagram of the bang-bang adjusting method. Referring to FIG. 1, in the bang-bang adjusting method, the integral path gain factor $\alpha$ and the proportional path gain factor $\beta$ of the digital filter 130 are set to be initial values $\alpha_0$, $\beta_0$, in step S501. The BBPD 110 receives the input data signal Datain in step S502 and compares a phase difference between the input data signal Datain and the sampling clock signal RCLK in step S503. The BBPD 110 outputs a phase difference information signal PD to the ALGC circuit 150 and the digital filter 130. The ALGC circuit 150 detects whether a first plurality (i.e., a predetermined quantity) of the consecutive (continuous) logic values in the phase difference information signal are the same, in step S504. In other words, the ALGC circuit 150 detects whether the first plurality of the consecutive logic values "0"s, such as 000, or the first plurality of the consecutive logic values "1"s, such as 111, appear in the phase difference information signal. The number of consecutive logic values "1"s or "0"s may be 3 at least. When the loop bandwidth of the CDR circuit 100 is too narrow, the ALGC circuit 150 may detect the phase difference information signal PD including the first plurality of continuous logic "1"s or "0"s which are the same in step S504. In such a condition, the ALGC circuit 150 may adjust the proportional path gain factor $\beta$ by adding one unit step ($\beta_{step}$) and adjust the integral path gain factor $\alpha$ to keep the predetermined ratio $\beta/\alpha=\beta_0/\alpha_0$, in step S514. Consequently, the loop gain of the CDR circuit 100 may be increased such that the loop bandwidth of the CDR circuit 100 may be increased. On the other side, when the loop bandwidth of the CDR circuit 100 is too wide, the ALGC circuit 150 may detect phase difference information signal PD including the first plurality of consecutive logic values which are not the same in step S504. This result means the ALGC circuit 150 probably detects two consecutive same logic values at most such as 001 or 110, not the expected three consecutive same logic values 111 or 000, or detects continuous alternate logic values (i.e., logics values bouncing between 1 and 0) such as 101 or 010. In such a condition, the ALGC circuit 150 may adjust the proportional path gain factor $\beta$ by subtracting one unit step ($\beta_{step}$) and adjust the integral path gain factor $\alpha$ to keep the predetermine ratio $\beta/\alpha=\beta_0/\alpha_0$, in step S524.

In another perspective, step S504 of the bang-bang adjusting method in FIG. 5 may be replaced with step S504' (not shown in FIG. 5). In step S504', the ALGC circuit 150 detects whether the first plurality (i.e., the predetermined quantity) of the consecutive logic values in the phase difference information signal are alternate, e.g. 101 or 010 (in a case if the predetermined number of consecutive logic values is three). When the loop bandwidth of the CDR circuit 100 is too wide, in step S504' the ALGC circuit 150 may detect the phase difference information signal including a plurality of consecutive logic values "1"s or "0"s which are alternate, which means logics values are bouncing between 1 and 0 (e.g., 1010 . . . ). In such a condition, the ALGC circuit 150 execute step S524 to adjust the proportional path gain factor $\beta$ by subtracting one unit step ($\beta_{step}$) and adjust the integral path gain factor $\alpha$ to keep the predetermine ratio $\beta/\alpha=\beta_0/\alpha_0$. As a result, the loop gain of the CDR circuit 100 may be decreased such that the loop bandwidth of the CDR circuit 100 may be reduced. On the other side, when the loop bandwidth of the CDR circuit 100 is too narrow, in step S504' the ALGC circuit 150 may detect the phase difference information signal including the first plurality of consecutive logic values which are not alternate, which means the ALGC circuit 150 probably detects two or three consecutive same logic values such as 001, 110, 000 or 111, not the expected three alternate logic values 101 or 010. In such as condition, the ALGC circuit 150 execute step S514 to adjust the proportional path gain factor $\beta$ by adding one unit step ($\beta_{step}$) and adjust the integral path gain factor $\alpha$ to keep the predetermine ratio $\beta/\alpha=\beta_0/\alpha_0$. As a result, the loop gain of the CDR circuit 100 may be increased such that the loop bandwidth of the CDR circuit 100 may be increased. In another example, when the ALGC circuit 150 detects two consecutive same logic values at most in every three consecutive logic values, such as 001 or 110, not the expected three same logic values 000, 111 or three alternate logic values 101 or 010, the ALGC circuit 150 may not to adjust the gain factors and remains the gain factors the same as the previous.

Referring to FIG. 4 and FIG. 5, the phase difference information detecting circuit 410 of the ALGC circuit 400 is a circuit implementing step S504 (or S504'), and the bandwidth adjusting circuit 420 of the ALGC circuit 400 is a circuit implementing steps S514 and S524.

Figure 6:
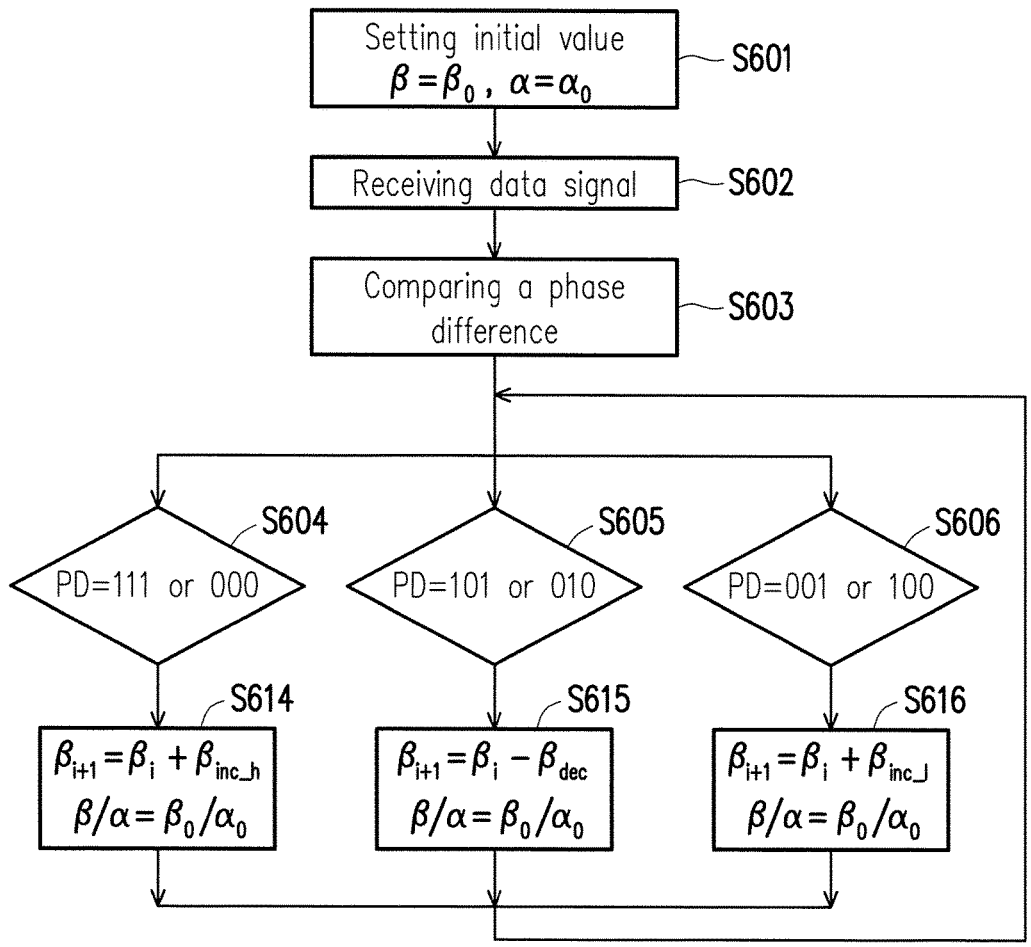
FIG. 6 is a flow chart diagram of a linear adjusting method according to an exemplary embodiment of the disclosure.

FIG. 6 is a flow chart diagram of a linear adjusting method, where the integral path gain factor $\alpha$ and the proportional path gain factor $\beta$ are adjusted in different degrees based on different logic patterns that a first plurality of consecutive logic values match, or in equivalent, based on different sign patterns indicated by the first plurality of consecutive logic values. The linear adjusting method may be implemented by using a finite-state machine. The steps of the linear adjusting method are as follows.

Referring to FIG. 1, the integral path gain factor $\alpha$ and the proportional path gain factor $\beta$ of the digital filter 130 are set to be initial values $\alpha_0$, $\beta_0$, in step S601. The BBPD 110 receives the input data signal Datain in step S602 and compares a phase difference between the input data signal Datain and the sampling clock signal RCLK in step S603. The BBPD 110 outputs the phase difference information signal PD to the ALGC circuit 150 and the digital filter 130. Next, the ALGC circuit 150 detects a pattern that a first plurality (i.e., a predetermined quantity) of the consecutive logic value match, and adjusts the gain factors $\alpha$, $\beta$ according to the detected pattern. In this exemplary flowchart, the number (i.e., first plurality) of the consecutive logic values is 3 bits as an example. The number of the consecutive logic values to be monitored is not limited to three, and may be any positive integer lager than two, so that conditions to increase/reduce the gain factors $\alpha$, $\beta$ may be considered more precisely.

In FIG. 6, the detecting step and different detected patterns are respectively presented by steps S604, S605 and S606, based on the number of the consecutive logic values of the detected pattern is 3. In step S604, if the ALGC circuit 150 detects the three consecutive logic values match 111 or 000, which means the signs indicated by the phase difference information signal do not change (due to a too small loop gain), then in step S614 the ALGC circuit 150 increases the proportional path gain factor $\beta$ by a larger pre-set value $\beta_{inc\_h}$.

In step S606, if the ALGC circuit 150 detects the three consecutive logic values match 001 or 100, which means the signs indicated by the phase difference information signal change once (due to a smaller loop gain), then in step S616 the ALGC circuit 150 increases the proportional path gain factor $\beta$ by a smaller pre-set value $\beta_{inc\_l}$ smaller than the larger pre-set value $\beta_{inc\_h}$. In step S605, if the ALGC circuit 150 detects the three consecutive logic values match 010 or 101, which means the signs indicated by the phase difference information signal change in every period (due to a too large loop gain), then in step S615 the ALGC circuit 150 decreases the proportional path gain factor β by a pre-set value $β_{dec}$. For example, the pre-set value $β_{inc\_h}=3$, $β_{inc\_1}=1$, and $β_{dec}=2$. Moreover, in each of steps S614, S615 and S616, the ALGC circuit 150 may also adjust the integral path gain factor α to keep $β/α=β_0/α_0$.

Referring to FIG. 4 and FIG. 6, the phase difference information detecting circuit 410 of the ALGC circuit 400 is a circuit implementing steps S604, S605 and S606, and the bandwidth adjusting circuit 420 of the ALGC circuit 400 is a circuit implementing steps S614, S615 and S616.

Figure 7:
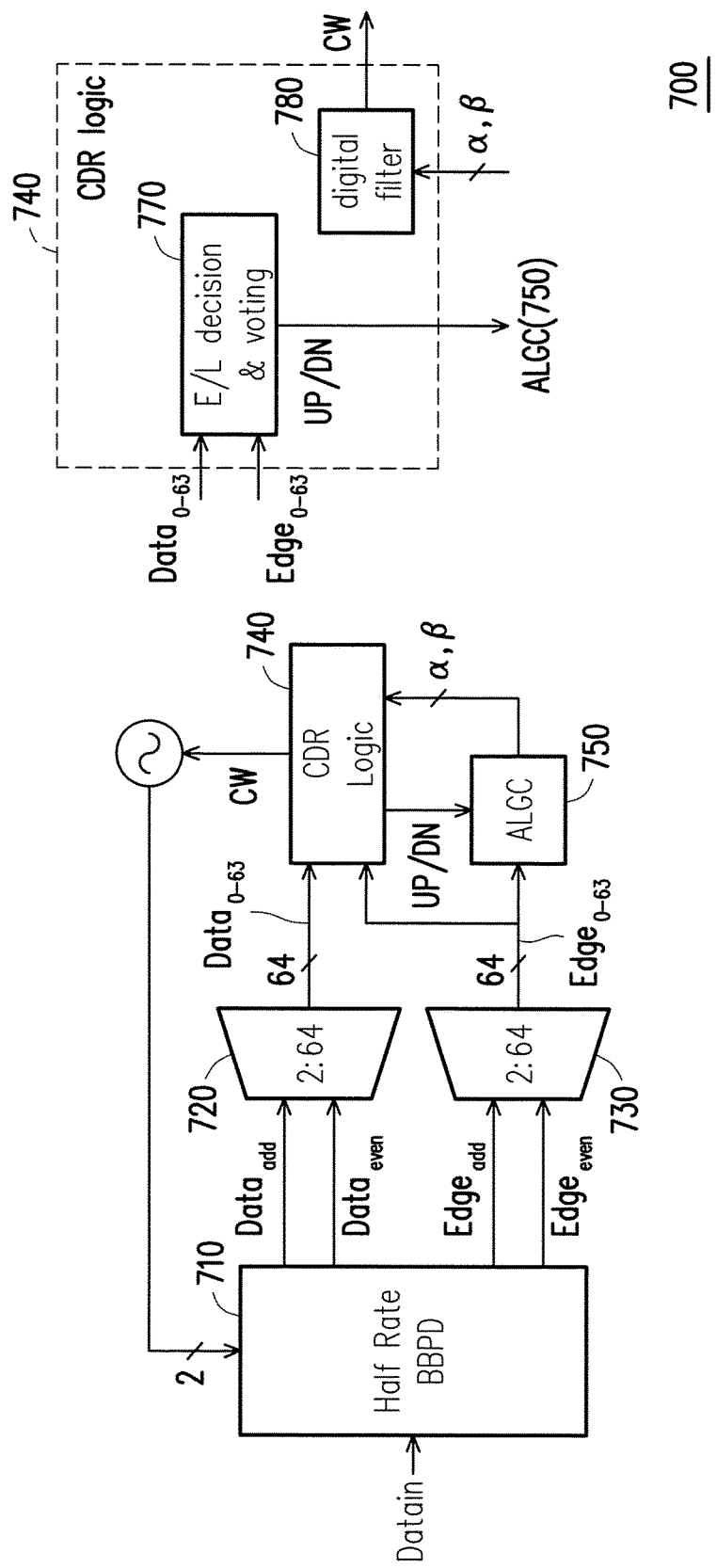
FIG. 7 is a schematic circuit block diagram of a CDR circuit according to yet another exemplary embodiment of the disclosure.

In the present disclosure, there are several embodiments to implement the CDR circuit. Some of embodiments are described as follows. FIG. 7 is a schematic circuit block diagram of a clock and data recovery (CDR) circuit 700 according to yet another exemplary embodiment of the disclosure. A half rate BBPD 710 receives the input data signal Datain, samples the input data signal Datain by using two sampling clock signals which have same frequency and inverse phases. The half rate BBPD 710 samples the input data signal Datain at clock rising edges to generate plurality of rising edge sampled data, denoted as $Data_{odd}$ and $Data_{even}$, and also samples the input data signal Datain at clock falling edges to generate plurality of falling edge sampled data, denoted as $Edge_{odd}$ and $Edge_{even}$. Two de-multiplexers (2:64) 720 and 730 are coupled to the half rate BBPD 710 and are utilized for converting high speed data to lower speed data. The de-multiplexer 720 receives the plurality of rising edge sampled data $Data_{odd}$ and $Data_{even}$, and outputs 64 lower speed rising edge sampled data $Data_0$-$Data_{63}$; and the de-multiplexer 730 receives the plurality of falling edge sampled data $Edge_{odd}$ and $Edge_{even}$, and outputs 64 lower speed falling edge sampled data $Edge_0$-$Edge_{63}$. The index 0-63 indicates a timing order that the data and edge are sampled.

Figure 8:
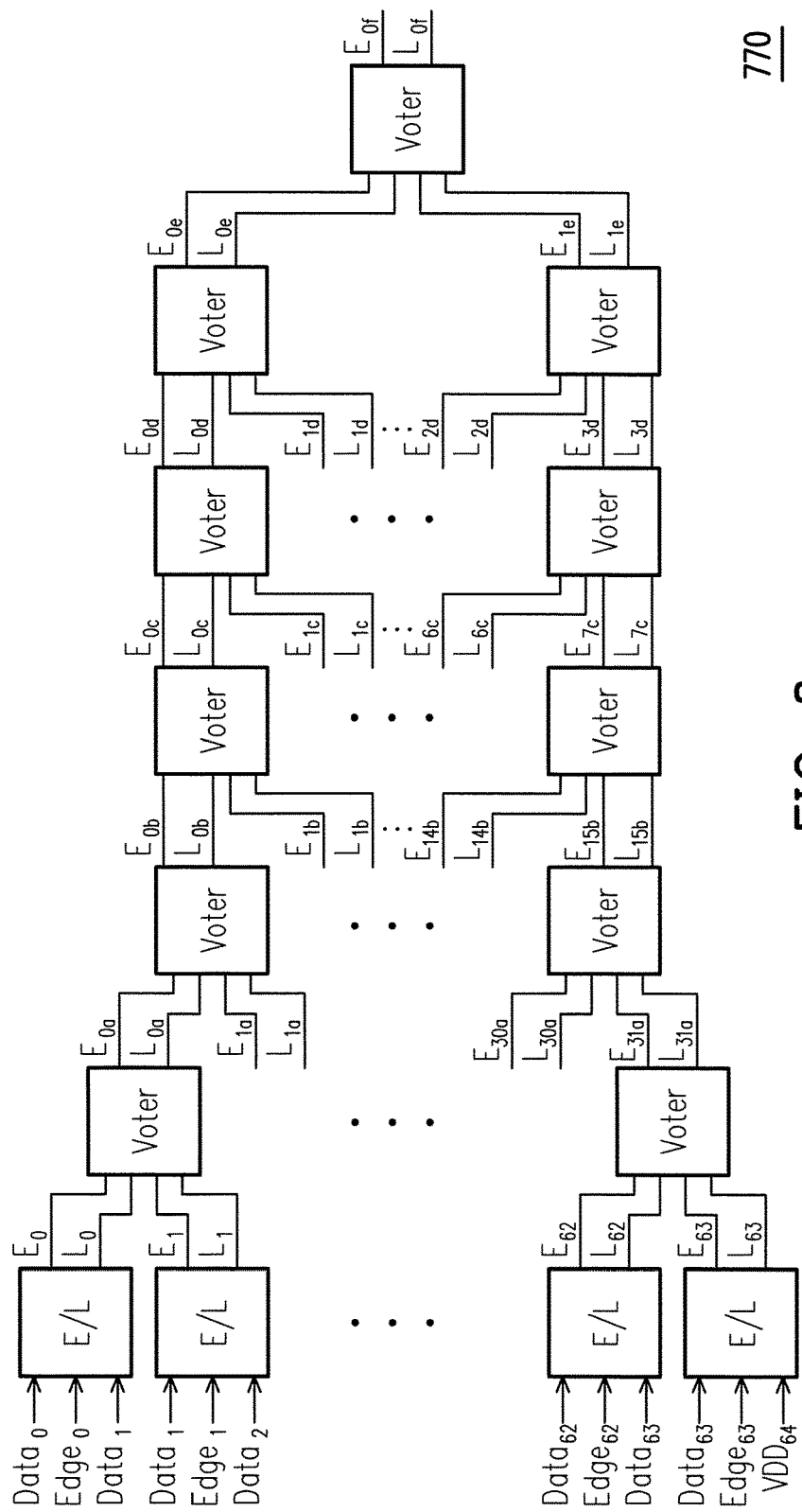
FIG. 8 is a schematic circuit block diagram of an early/late (E/L) decision and voting circuit according to an exemplary embodiment of the disclosure.

A CDR logic circuit 740 includes an early/late decision and voting circuit 770 and a digital filter 780. FIG. 8 is a schematic circuit block diagram of the early/late (E/L) decision and voting circuit 770 according to an exemplary embodiment of the disclosure. The early/late decision and voting circuit 770 receives the rising edge sampled data $Data_{odd}$ and $Data_{even}$ and the falling edge sampled data $Edge_0$-$Edge_{63}$, generates an initial early or late (abbreviated to E/L) result based on every consecutive two of the rising edge sampled data $Data_0$-$Data_{63}$ and one of the falling edge sampled data $Edge_0$-$Edge_{63}$ which is between the consecutive two rising edge sampled data, such as $Data_0$, $Edge_0$ and $Data_1$ as shown in FIG. 8. The early/late decision and voting circuit 770 finally generates a final early or late result after performing several voting stages. A phase difference information signal UP/DN may be a one-bit logic value "0" or "1" generated according to the final early or late result. In another example, a phase difference information signal UP/DN may be two separate one-bit logic values generated according to the final early or late result, wherein one logic value presents UP and the other logic value presents DN. The phase difference information signal UP/DN is outputted to an ALGC circuit 750 and the digital filter 780. The ALCG circuit 750 may detect the first plurality of consecutive logic values in the phase difference information signal and adjust the proportional path gain factor β and the integral path gain factor α according to the first plurality of consecutive logic values, based on the mentioned bang-bang adjusting method or the linear adjusting method. The loop bandwidth of the CDR circuit 700 can be adjusted by the gain factor α and β determined by the ALGC circuit 750.

More details related to the early/late decision and voting circuit 770 are as follows. The early/late decision and voting circuit 700, as shown in FIG. 8, can be divided into 7 circuit levels, wherein the first circuit level includes 64 E/L decision blocks and subsequent six circuit levels are voting blocks (voters). Every E/L decision block generate a respective initial E/L result based on three sampled data ($Data_{k-1}$, $Edge_{k-1}$, $Data_k$), which includes every two consecutive rising edge sampled data and one falling edge sampled data between the two consecutive rising edge sampled data, wherein k is an integer from $\{1, 2, 3, \ldots, 64\}$. Each initial E/L result is presented by one-bit value $E_k$ and one-bit value $L_k$ and each initial E/L result indicates that the sampling clock signal (RCLK) is early or late than the input data signal (Datain). If based on ($Data_{k-1}$, $Edge_{k-1}$, $Data_k$) it is determined that the sampling clock signal is early than the input data signal (i.e., clock early), $E_k=1$ and $L_k=0$; if based on ($Data_{k-1}$, $Edge_{k-1}$, $Data_k$) it is determined that the sampling clock signal is late than the input data signal (i.e., clock late), $E_k=0$ and $L_k=1$; and if based on ($Data_{k-1}$, $Edge_{k-1}$, $Data_k$) it is determined that there is no data transition, $E_k=0$ and $L_k=0$. Table 1 is a mapping table of ($Data_{k-1}$, $Edge_{k-1}$, $Data_k$) and the E/L result as follows. ($Data_{k-1}$, $Edge_{k-1}$, $Data_k$)=010 or 101 means errors may happen and the E/L result is Don't care (X).

TABLE 1

| $Data_{k-1}$ | $Edge_{k-1}$ | $Data_k$ | $E_k$ (Clock Early) | $L_k$ (Clock Late) | UP | DN |
|---|---|---|---|---|---|---|
| 0 | 0 | 0 | 0 | 0 | X | X |
| 0 | 0 | 1 | 1 | 0 | 0 | 1 |
| 0 | 1 | 0 | X | X | X | X |
| 0 | 1 | 1 | 0 | 1 | 1 | 0 |
| 1 | 0 | 0 | 0 | 1 | 1 | 0 |
| 1 | 0 | 1 | X | X | X | X |
| 1 | 1 | 0 | 1 | 0 | 0 | 1 |
| 1 | 1 | 1 | 0 | 0 | X | X |

The subsequent six circuit levels are voting blocks (voters). Each voting block generates an output E/L result by performing majority voting on two received E/L results. For example, a voting block in the second circuit level generates an output E/L result ($E_{0a}$, $L_{0a}$) based on two received E/L results ($E_0$, $L_0$) and ($E_1$, $L_1$), and a voting block in the third circuit level generates an output E/L result ($E_{0b}$, $L_{0b}$) based on two received E/L results ($E_{0a}$, $L_{0a}$) and ($E_{1a}$, $L_{1a}$), and so on. In the last (seventh) circuit level, there is only one voter, and this voter generates a final E/L result ($E_{0f}$, $L_{0f}$) based on two received E/L results outputted from the voting blocks in the sixth circuit level. Table 2 illustrates received E/L results ($E_k$, $L_k$) and ($E_{k+1}$, $L_{k+1}$) and the corresponding output E/L result.

TABLE 2

| | $E_{k+1} L_{k+1}$ | | |
|---|---|---|---|
| $E_k L_k$ | 10 | 00 | 01 |
| 10 | 10 | 10 | 00 |
| 00 | 10 | 00 | 01 |
| 01 | 00 | 01 | 01 |

Referring to FIG. 8 and Table 1, the phase difference information signal UP/DN is determined based on the final E/L result ($E_{0f}$, $L_{0f}$). For example, two bits of the final E/L result $(E_{Of}, L_{Of})=(1, 0)$ which means the sampling clock signal RCLK is earlier than the input data signal Datain may be used for determining that a two-bit phase difference information signal UP=0 and DN=1. In another example, only one of two bits of the final E/L result $(E_{Of}, L_{Of})$, either $E_{Of}$ or $L_{Of}$ may be taken as a one-bit phase difference information signal.

Exemplary implementation details of the CDR logic 740 and the ALGC circuit 750 are shown in formulas in Table 3:

data signal Datain by using two sampling clock signals which have same frequency and inverse phases. An E/L decision and the generation of a phase difference information signal UP/DN (up or down) are implemented in the half-rate BBPD 910. In an example, the E/L decision and voting circuit shown in FIG. 8 may be implemented in the half-rate BBPD 910 to generate the phase difference information signal UP/DN. It is noted that the implementation of the half-rate BBPD 910 is not limited, and "half-rate" is also

TABLE 3

ALGC $$\beta(n) = \beta(n-1) + \beta_{step} \cdot \text{segment}_{tap}\left(\sum_{k=0}^{tap} E(n) \cdot E(n-k)\right), \text{ for } n \geq tap \text{ and } n,$$

$$tap \in \mathbb{N}, \beta(tap) = \beta_0, \beta(n) = 0 \text{ if } n < tap$$

$$\alpha(n) = \alpha(n-1) + \alpha_{step} \cdot \text{segment}_{tap}\sum_{k=0}^{tap} E(n) \cdot E(n-k)), \text{ for } n \geq tap \text{ and } n,$$

$$tap \in \mathbb{N}, \alpha(tap) = \alpha_0, \alpha(n) = 0 \text{ if } n < tap$$

CDR Logic $$CW(n) = CW(0) + \beta(n) \cdot dri(n) + \sum_{k=0}^{n} \alpha(k) \cdot dri(k)$$

$$dri = \text{sign}\left(\sum_{i=0}^{63} \text{Early}(k) - \sum_{j=0}^{63} \text{Late}(k)\right) = \begin{cases} -1, \text{ if } (\ldots) \geq 0 \\ 1, \text{ if } (\ldots) < 0 \end{cases}$$

$$\text{Early}(k) = \overline{D_{k-1}E_{k-1}}D_k + D_{k-1}E_{k-1}\overline{D_k}$$

$$\text{Late}(k) = \overline{D_{k-1}}E_{k-1}D_k + D_{k-1}\overline{E_{k-1}}\overline{D_k}$$

$$k \in \{1, 2, 3, \ldots, 64\}$$

Remark:
1. sign(x) is a sign bit of x, which may be +1 or −1.
2. in the ALGC block, when the index at top of Σ is a, it means a + 1 continuous 0 or 1 are detected.
3. segment$_a$(x) is a segment function.

Example 1: $\text{segment}_a(x) = \begin{cases} 1, \text{ if } x > a \text{ or } x < -a \\ -1, \text{ otherwise} \end{cases}$ Example 2: $\text{segment}_{a/b/c}(x) = \begin{cases} -1, \text{ condition A} \\ 0, \text{ condition B} \\ 1, \text{ condition C} \end{cases}$ Example 3: $\text{segment}_{case1/case2/case3/case4}(x) = \begin{cases} -2, \text{ case1} \\ -1, \text{ case2} \\ 1, \text{ case3} \\ 2, \text{ case4} \end{cases}$ 4. k is an index of sampled data after Demux, and dri(n) indicates the phase difference information signal (UP/DN).

Figure 9:
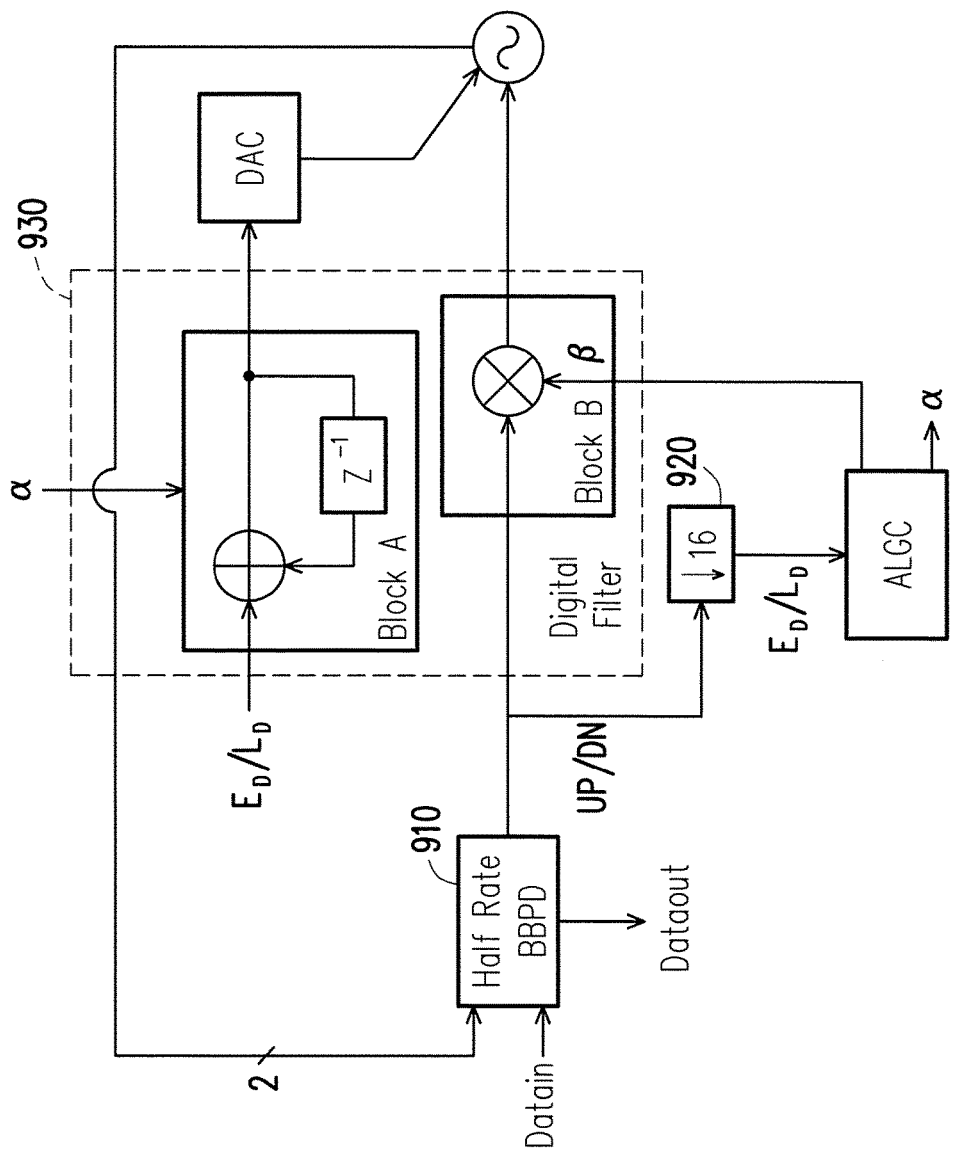
FIG. 9 is a schematic circuit block diagram of a CDR circuit according to still another exemplary embodiment of the disclosure.

FIG. 9 is a schematic circuit block diagram of a clock and data recovery (CDR) circuit 900 according to another exemplary embodiment of the disclosure. A half rate BBPD 910 receives a input data signal Datain and samples the input an example. In another example, a full-rate BBPD 910 may be used instead. A digital filter 930 includes a circuit block A and a circuit block B, and the detail operation of the circuit blocks A and B can be referred to the following Table 4:

TABLE 4

Block A $$i_o(n) = i_o(n-1) + \sum_{k=0}^{n} \alpha(k) \cdot \text{sign}(i_i(k)), \text{ for } n \geq 1 \text{ and } n \in \mathbb{N}, i_o(0) = i_{o,init}.$$

Block B $p_o(n) = \beta \cdot \text{sign}(p_i(n))$

ALGC-$\alpha$ $\alpha_{out}(n) = \alpha(n-1) + \alpha_{step} \cdot \text{segment}_{tap}(\Sigma_{k=0}^{tap} a(n) \cdot a(n-k)), \text{ for } n \geq tap \text{ and } n, tap \in \mathbb{N}, \alpha(tap) = \alpha_0, \alpha(n) = 0 \text{ if } n < tap$ TABLE 4-continued

ALGC-β

$$\beta_{out}(n) = \beta(n-1) + \beta_{step} \cdot \text{segment}_{tap}\left(\sum_{k=0}^{tap} a(n) \cdot a(n-k)\right), \text{ for } n \geq$$

tap and n, tap $\in \mathbb{N}$, $\beta(\text{tap}) = \beta_0$, , $\beta(n) = 0$ if $n < \text{tap}$ Remark:
1. $i_o(n)$ is an output of the block A, and $i_i(n)$ (= $E_D/L_D$) is an input of the block A.
2. $p_o(n)$ is an output of the block B, $p_i(n)$ is an input of the block B, and $p_i$ can be represented by UP/DN (1/0).
3. $\alpha_{out}$ is an output of the ALGC circuit, a is an input of the ALGC-α (which is a circuit block to generate α in the ALGC circuit), $\alpha_{step}$ is a step size for adjusting operation. In the embodiment, the early or late information ($E_D/L_D$) = a, α is the $\alpha_{out}$, and β is $\beta_{out}$.
4. $\beta_{out}$ is an output of the ALGC circuit, α is an input of the ALGC-β (which is a circuit block to generate β in the ALGC circuit), $\beta_{step}$ is a step size for adjusting operation.
5. "tap" indicates number (N) of continuous "1" or "0" which are needed to detect. N is any positive integer larger than 1.
6. sign(x) is a sign bit of x, which may be +1 or −1.
7. $\text{segment}_a(x)$ is a segment function.

Figure 10:
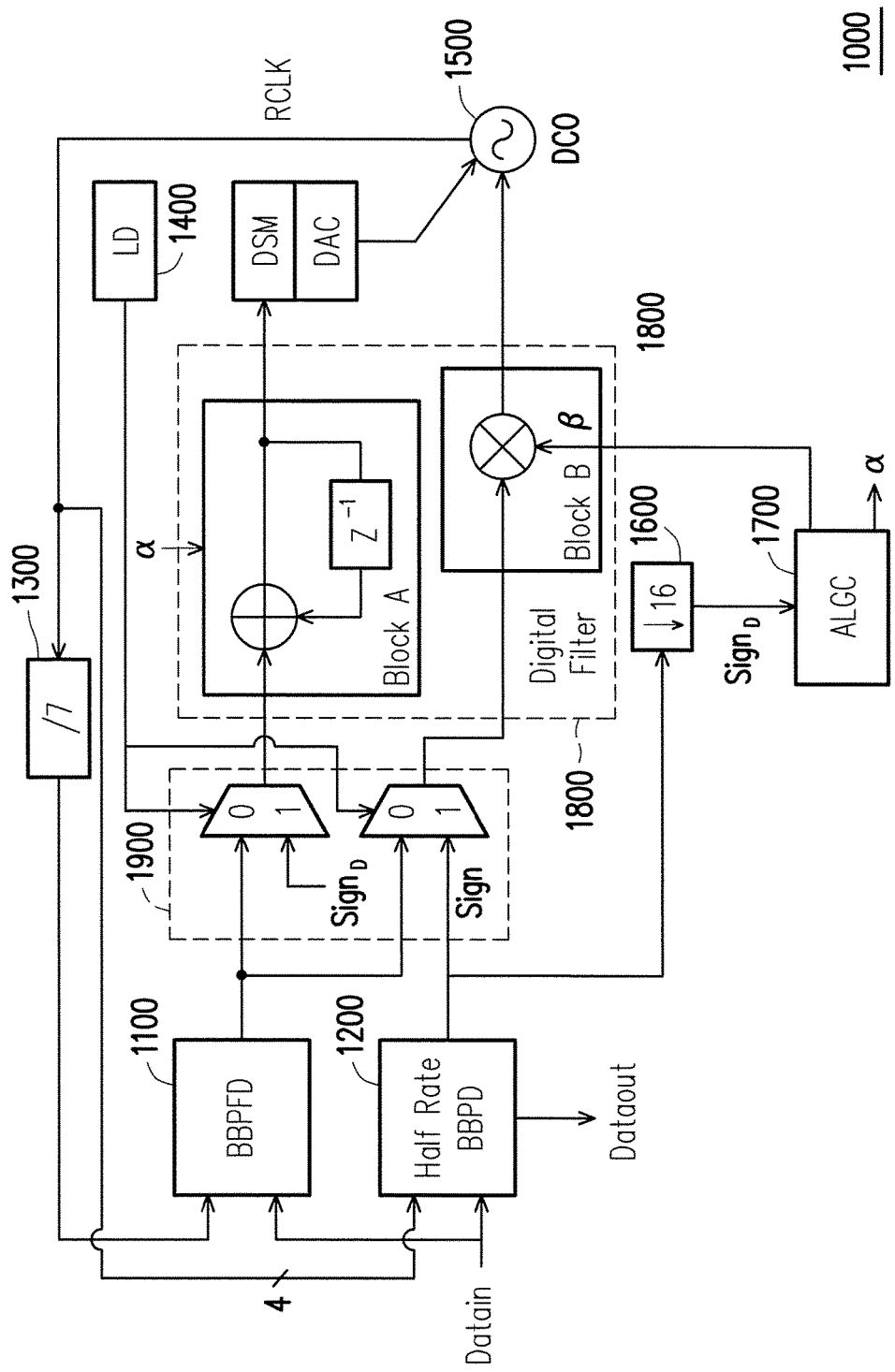
FIG. 10 is a schematic circuit block diagram of a CDR circuit according to further another exemplary embodiment of the disclosure.

Example 1: $\text{segment}_a(x) = \begin{cases} 1, & \text{if } x > a \text{ or } x < -a \\ -1, & \text{otherwise} \end{cases}$ Example 2: $\text{segment}_{a/b/c}(x) = \begin{cases} 1, & \text{condition A} \\ 0, & \text{condition B} \\ -1, & \text{condition C} \end{cases}$ Example 3: $\text{segment}_{case1/case2/case3/case4}(x) = \begin{cases} 2, & \text{case1} \\ 1, & \text{case2} \\ -1, & \text{case3} \\ -2, & \text{case4} \end{cases}$ FIG. 10 is a schematic circuit block diagram of a clock and data recovery (CDR) circuit 1000 according to a further exemplary embodiment of the disclosure. In an initial state, a bang-bang phase-frequency detector (BBPFD) 1100 is used for locking the frequency of a sampling clock signal RCLK (a.k.a. retime clock, generated by a digitally controlled oscillator (DCO) 1500) to the input data signal Datain until the frequency error is smaller than a predetermined value. A lock detector (LD) 1400 may detect whether the frequency of the sampling clock signal is locked to the input data signal and generates a lock detection signal. A 2-to-1 multiplexer (selecting circuit) 1900 is coupled between the BBPFD 1100, a half rate BBPD 1200 and a digital filter 1800. The multiplexer 1900 is controlled by the lock detection signal from the lock detector 1400 and switches an output signal either from the BBPFD 1100 or from the half rate BBPD 1200, which means the multiplexer 1900 selects a locked sampling clock signal from the BBPFD 1100 or a phase difference information signal (denoted as Sign in FIG. 10) from the half rate BBPD 1200 to transport to the digital filter 1800 according to the lock detection signal. During frequency locking, the multiplexer 1900 is switched to output the output signal of the BBPFD 1100. When the sampling clock frequency is locked, the BBPFD 1100 and a frequency divider (denoted as "/7") 1300 are turned off, and the half rate BBPD 1200 starts detecting the phase difference between the sampling clock signal RCLK and the input data signal Datain. In this embodiment, the frequency divider is used to divide the frequency of the sampling clock signal by 7.

The half rate BBPD 1200 generates the phase difference information signal (Sign) which indicates the polarity sign (+, −) of the phase difference between the sampling clock signal and the input data signal Datain. The phase difference information signal (Sign) may be presented by one bit ("1" or "0"). In this embodiment, "half rate" means the phase compensation rate of the half rate BBPD 1200 is a half of data rate of the input data signal Datain. The half rate BBPD 1200 is used instead of a full rate BBPD when the digitally controlled oscillator (DCO) 1500 may not be able to provide such a high frequency sampling clock signal that the full rate BBPD requires. The phase difference information signal (Sign) is down-sampled by a 1/16 down-sampling circuit 1600 and the down-sampled phase difference information signal ($\text{Sign}_D$) is sent to the ALGC circuit 1700. The ALGC circuit 1700 may adjust the gain factors α and β according to the down-sampled phase difference information signal ($\text{Sign}_D$) by using the aforementioned bang-bang adjusting method or the linear adjusting method. The digital filter 1800 adjusts the open loop gain according to the gain factors α and β so that the loop bandwidth is adjusted. A delta-sigma modulator (DSM) can be used to increase a frequency resolution of the DCO 1500.

Figure 11:
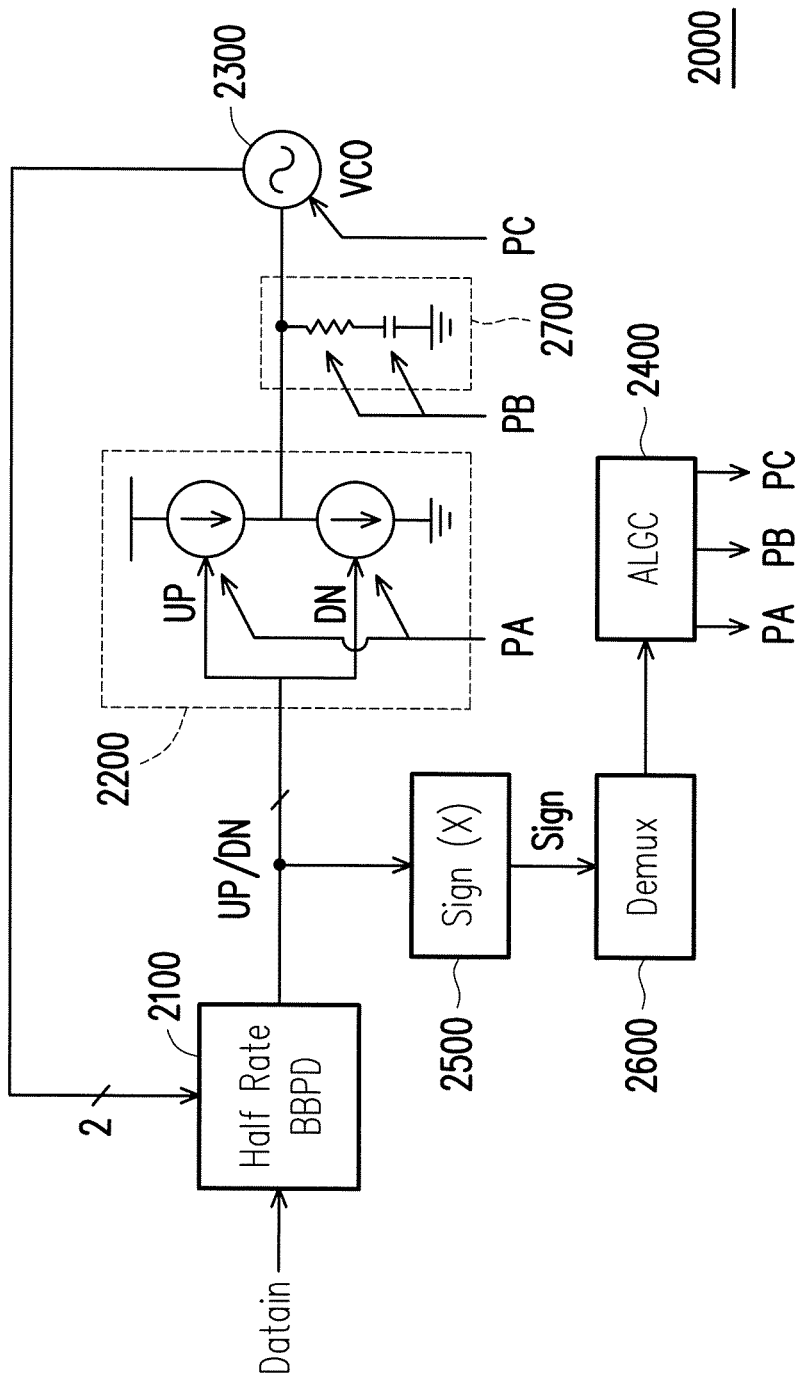
FIG. 11 is a schematic circuit block diagram of a CDR circuit according to still another exemplary embodiment of the disclosure.

FIG. 11 is a schematic circuit block diagram of a CDR circuit 2000 according to still another exemplary embodiment of the disclosure. Different from the aforementioned digital CDR circuits, the CDR circuit 2000 is an analog CDR circuit. In the embodiment of FIG. 11, a charge pump circuit 2200 and a loop filter 2700 are provided as an analog filter. The charge pump circuit 2200 is coupled to a half rate BBPD 2100 and an ALGC circuit 2400 to receive a phase difference information signal from the half rate BBPD 2100 and parameters PA from the ALGC circuit 2400. A Sign(x) block 2500 receives a phase difference information signal UP/DN outputted from the half rate BBPD 2100, which includes two separate one-bit values (wherein one is UP and the other is DN), and the Sign(x) block 2500 converts the phase difference information signal UP/DN to a one-bit signal Sign. The signal Sign is down-sampled by the Demux block 2600 and outputted to the ALGC circuit 2400. Accordingly, the ALGC circuit 2400 may generate parameters PA to adjust setting of current sources in the charge pump circuit 2200, generates parameters PB to adjust the resistance and/or capacitance of the loop filter 2700, and generates a parameter PC to adjust gain setting of a voltage controlled oscillator (VCO) 2300, such that the loop bandwidth of the CDR circuit 2000 can be adjusted accordingly. The loop filter 2700 is coupled to the charge pump circuit 2200 and the ALGC circuit 2400, receives the pumped voltage and the parameters PB. The VCO 2300 may generate a sampling clock signal according to the output signal of the loop filter 2700.

Embodiments of the present disclosure provides a better output jitter and large jitter tolerance. When the data transition density has a low value, the CDR circuit according to the embodiments may be able to maintain a proper loop bandwidth and increase jitter tolerance. When the data transition density or jitter varies dramatically, the CDR circuit may maintain jitter tolerance. The gain factors (integral path gain factor and proportional path gain factor) are increased/decreased by the loop gain controller to achieve the loop bandwidth adjustment in CDR circuit.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A clock and data recovery (CDR) circuit, comprising:
   a phase detector, detecting a phase difference between an input data signal and a sampling clock signal, and generating a phase difference information signal which indicates a sign of the phase difference;
   a loop gain controller, coupled to the phase detector, detecting a first plurality of consecutive logic values in the phase difference information signal, and adjusting gain factors according to whether the first plurality of consecutive logic values are the same or alternate;
   a filter, coupled to the loop gain controller and the phase detector, filtering the phase difference information signal to generate a filtered signal according to the gain factors; and
   an oscillator, coupled to the filter and the phase detector, receiving the filtered signal and generating the sampling clock signal according to the filtered signal.

2. The CDR circuit according to claim 1, wherein the loop gain controller increases the gain factors in response to detecting that the consecutive logic values are the same, and wherein the gain factors comprises an integral path gain factor and proportional path gain factor.

3. The CDR circuit according to claim 2, wherein the loop gain controller increases the proportional path gain factor and increases the integral path gain factor to keep a predetermined ratio of the proportional path gain factor to the integral path gain factor.

4. The CDR circuit according to claim 1, wherein the loop gain controller decreases the gain factors in response to detecting that the consecutive logic values are not the same, and wherein the gain factors comprises an integral path gain factor and proportional path gain factor.

5. The CDR circuit according to claim 4, wherein the loop gain controller decreases the proportional path gain factor and decrease the integral path gain factor to keep a predetermined ratio of the proportional path gain factor to the integral path gain factor.

6. The CDR circuit according to claim 1, wherein the loop gain controller decreases the gain factors in response to detecting that the consecutive logic values are alternate, and wherein the gain factors comprises an integral path gain factor and a proportional path gain factor.

7. The CDR circuit according to claim 6, wherein the loop gain controller decreases the proportional path gain factor and decreases the integral path gain factor to keep a predetermined ratio of the proportional path gain factor to the integral path gain factor.

8. The CDR circuit according to claim 1, wherein the loop gain controller increases the gain factors in response to detecting that the consecutive logic values are not alternate, and wherein the gain factors comprise an integral path gain factor and a proportional path gain factor.

9. The CDR circuit according to claim 8, wherein the loop gain controller increases the proportional path gain factor and increases the integral path gain factor to keep a predetermined ratio of the proportional path gain factor to the integral path gain factor.

10. The CDR circuit according to claim 1, wherein the loop gain controller adjusts the gain factors according to a pattern that the first plurality of consecutive logic values match, and wherein the gain factors comprises an integral path gain factor and a proportional path gain factor.

11. The CDR circuit according to claim 10, wherein the loop gain controller adjusts the integral path gain factor to keep a predetermined ratio of the proportional path gain factor to the integral path gain factor.

12. The CDR circuit according to claim 1, wherein the loop gain controller comprises:
    a phase difference information detecting circuit, receiving the phase difference information signal, and detecting the first plurality of consecutive logic values in the phase difference information signal; and
    a bandwidth adjusting circuit, coupled to phase difference information detecting circuit, adjusting the gain factors according to the first plurality of consecutive logic values.

13. The CDR circuit according to claim 1, further comprising:
    a down sampler, coupled to the phase detector, receiving and down sampling the phase difference information signal to generate a down-sampled phase difference information signal,
    wherein the down-sampled phase difference information signal is provided to the loop gain controller and the filter.

14. The CDR circuit according to claim 1, wherein the phase detector comprises:
    a half rate bang-bang phase detector, respectively sampling the input data signal by the sampling clock signal at rising edges and falling edges of the sampling clock signal to generate a plurality of first sampled data sampled at the rising edges and a plurality of second sampled data sampled at the falling edges;
    a de-multiplexer, coupled to the half rate bang-bang phase detector, converting the plurality of first sampled data and the plurality of second sampled data to a plurality of rising edge sampled data and a plurality of falling edge sampled data; and
    a decision and voting circuit, coupled to the de-multiplexer, generating final early or late information according to the plurality of rising edge sampled data and the plurality of falling edge sampled data, and generating the phase difference information signal according to the early or late information.

15. The CDR circuit according to claim 14, wherein the decision and voting circuit comprises:

a plurality of early or late decision circuits, wherein, each of the early or late decision circuit receives consecutive two of the plurality of rising edge sampled data and one falling edge sampled data therebetween and generates an initial early or late information; and
a plurality of voting stages, coupled to the early or late decision circuits in series, each voting stage operating a majority voting operation on received early or late information to generate early or late information to be outputted, wherein the last voting stage of the plurality of voting stages generates the final early or late information.

16. The CDR circuit according to claim 1, wherein the filter comprises:
a charge pump circuit, coupled to the phase detector and the loop gain controller, receiving the phase difference information signal from the phase detector and receiving control parameters associated with a current of the charge pump circuit from the loop gain controller; and
a loop filter, coupled to the charge pump circuit and the loop gain controller, receiving an output voltage signal from an output end of the charge pump circuit, receiving control parameters associated with the loop filter from the loop gain controller, and generating the filtered signal according to the output voltage signal on the output end of the charge pump circuit.

\* \* \* \* \*